(12) United States Patent
Zommer (10) Patent No.: US 6,323,090 B1
(45) Date of Patent: Nov. 27, 2001

(54) SEMICONDUCTOR DEVICE WITH TRENCHED SUBSTRATE AND METHOD

(75) Inventor: Nathan Zommer, Los Altos, CA (US)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 09/332,638

(22) Filed: Jun. 9, 1999

(51) Int. Cl.[7] .................................................. H01L 21/336
(52) U.S. Cl. ........................ 438/270; 438/429; 438/416; 438/271
(58) Field of Search .................... 438/271, 270, 438/268, 156, 416, 429, 276

(56) References Cited

U.S. PATENT DOCUMENTS

| | | | |
|---|---|---|---|
| 4,102,714 | * | 7/1978 | DeBar et al. ................ 148/187 |
| 4,199,774 | | 4/1980 | Plummer . |
| 4,369,564 | * | 1/1983 | Hiltpold ....................... 29/571 |
| 4,407,058 | * | 10/1983 | Fatula, Jr. et al. ............ 29/571 |
| 4,639,754 | | 1/1987 | Wheatley et al. . |
| 4,729,009 | * | 3/1988 | Ang ............................. 357/54 |
| 5,086,324 | | 2/1992 | Hagimo . |
| 5,591,655 | * | 1/1997 | Blanchard ..................... 437/31 |
| 5,904,535 | * | 5/1999 | Lee ............................ 438/341 |
| 5,960,271 | * | 9/1999 | Wollesen et al. ............ 438/197 |
| 6,037,239 | * | 3/2000 | Jennings ...................... 438/430 |

OTHER PUBLICATIONS

Baliga et al., "The Insulated Gate Rectifier (IGR): A New Power Switching Device," Proceeding of the IEDM, pp. 264–267 (1982).

Baliga, B.J., "How the Super–Transistor Works," *Scientific American: "The Solid State Century"*, pp. 34–41 (1997).

Farzan et al., "Depletion V–Groove MOS (VMOS) Power Transistors," *Solid State Electronics*, 19:297–306 (1976).

Mok et al., "The Characteristics and Application of a V–Shaped Notched Channel VFET," *Solid State Electronics*, 19:159–166 (1976).

Salama, C.A.T., "A New Short Channel MOSFET Structure 9UMOST)," *Solid State Electronics*, 20:1003–1009 (1977).

Tamer et al., "Numerical Comparison of DMOS, VMOS, and UMOS Power Transactions," *IEEE Transistors on Electron Devices*, vol. Ed–30(1) (Jan. 1983).

Yang, Paul Ou, "Double Ion Implanted V–MOS Technology," *IEEE Journal of Solid State Circuits*, vol. Sc–12(1) (Feb. 1977).

* cited by examiner

*Primary Examiner*—Richard Elms
*Assistant Examiner*—Bradley Smith
(74) *Attorney, Agent, or Firm*—Townsend and Townsend and Crew LLP (57) ABSTRACT

A transistor structure has a recess formed in the upper surface of its base layer, an epitaxial (epi) layer grown on the upper surface in a manner to create a surface depression in the outer surface of the epi layer, the surface depression being generally aligned with the recess. A semiconductor element, such as a well or a gate, is formed on the epi layer aligned with the recess.

9 Claims, 7 Drawing Sheets

SEMICONDUCTOR DEVICE WITH TRENCHED SUBSTRATE AND METHOD

BACKGROUND OF THE INVENTION

Traditional power transistors are constructed on planar semiconductor wafers. Such conventional devices are described in the following four references. B. J. Baliga et al., "The Insulated Gate Rectifier (IGR): A New Power Switching Device", *Proceeding of the IEDM,* 1982, pp.264–267. B. J. Baliga, "How the Super-Transistor Works", *Scientific American: "The Solid State Century",* 1997 pp. 34–41. U.S. Pat. No. 4,639,754, C. F. Wheatley et al., Jan. 27, 1987. U.S. Pat. No. 5,086,324, H. Hagimo, Feb. 4, 1992. However some transistor were developed in which the structure is nonplanar. The nonplanar devices are often called "V groove" devices, "V Mos", "U Mos", "trench etched Mosfets", etc., describing in their name the shape of the surface after the etching process. Such devices are described in the following six references. T. D. Mok and C. A. T. Salama, "The Characteristics and Application of a V-Shaped Notched-Channel VFET," *Solid State Electronics,* 1976 Vol. 19 pp.159–166. B. Farzan and C. A. T. Salama, "Depletion V-Groove MOS (VMOS) Power Transistors", *Solid State Electronics,* 1976 Vol. 19 pp.297–306. C. A. T. Salama, "A New Short Channel MOSFET Structure (UMOST), *Solid State Electronics,* 1977 Vol. 20, pp.1003–1009. Paul Ou-Yang, "Double Ion Implanted V-MOS Technology," *IEEE Journal of Solid State Circuits,* Vol. Sc-12, No. 1, February 1977. A. A. Tamer et al., "Numerical Comparison of DMOS, VMOS, and UMOS Power Transactions", *IEEE Transistors on Electron Devices,* Vol. Ed-30, No.1, January 1983. U.S. Pat. No. 4,199,774, "Monolithic Semiconductor Switching Device" J. D. Plummer, Apr. 22, 1980.

Figure 1:
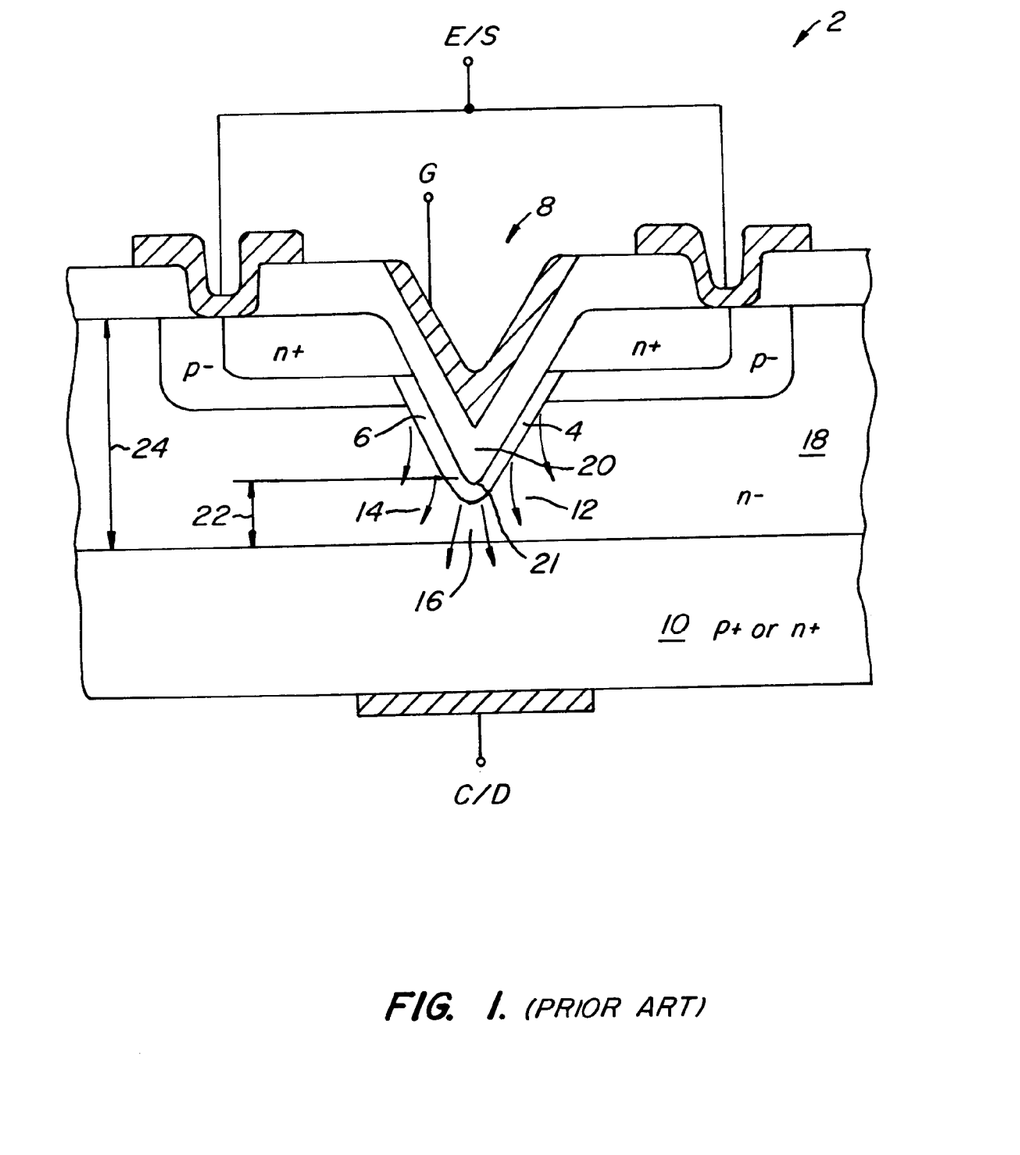
FIG. 1 is a simplified cross sectional view of a prior art V groove Mosfet device illustrating how close the tip of the gate oxide region gets to the substrate.

Some of the advantages cited for the non-planar structures include the following. a. For low voltage Mosfets, typically below about 200 v breakdown, reduced "on" resistance. b. Higher cell density, which results in higher gain devices. c. FIG. 1 illustrates a conventional V groove Mosfet 2 in which the conducting channels 4, 6 under gate 8 are angled towards substrate 10, thus improving current spreading in the drift regions 12, 14, 16 in n– epi layer 18, thus reducing the J FET effect. However, due to the more complex processing required in etching the grooves or trenches in the top surface of the FETs, and the poorer reliability of nonplanar devices, as will be explained below, these devices are not the preferred ones when it came to power Mosfets and Igbts. The standard planar DMOS devices are preferred in all voltage ranges, especially in the higher voltage ranges, about 100 v and above.

Power transistors are produced in two typical structures, one is epitaxial (epi) based and the other is bulk based. The first type is composed of a low resistivity semiconductor (SC) substrate on which a layer of higher resistivity SC material is grown epitaxially, like the example shown in FIG. 1, where epi layer 18 is grown on substrate 10. The epi resistivity and thickness are selected for the desired breakdown voltage (BV) of the device. The bulk structure, on the other hand, is composed of one type of resistivity SC region, typically a high resistivity float zone (FZ) grown SC wafer. For clarity of illustration the examples discussed will be Si SC crystal material. The same concepts apply to other SC materials like GaAs, SiC, etc. In both structures, devices have been produced where the etching of the grooves was done on the surface of the high resistivity region, followed by the gate oxidations. The etching of the grooves creates damage, uneven surface morphology, particles, decoration or delineation of crystal defects, etc., which hampers the subsequent critical processing steps on the surface of these devices. The top surface of the SC device is the critical yield and performance critical surface. The focus of SC processing is to minimize surface defects in order to increase the yield. Yet the etching processes used to create the grooves on the top surfaces do the opposite—they reduce the yield. The sharp corners and internal edges of these grooves create weak points in the gate oxide, accumulate contaminants and particles during processing which are difficult to remove in subsequent cleaning processes, thus create weak and contaminated gate oxides, such as gate oxide region 20 in FIG. 1. Thus, V groove, U groove, or trench Mosfets often have unstable turn on voltage, called threshold voltages (Vt) in their data sheets, have low oxide breakdown voltage, and have high failure rates under gate voltage bias tests.

Furthermore, as shown in FIG. 1, the fact that the groove is etched from the top surface into the high resistivity epi layer 18, the n– epi layer in this example, reduces the net epi layer thickness under the tip 21 of the groove formed in epi layer 18. This thickness is 22 is less than the original, as-deposited epi thickness 24. The epi thickness 24 is usually selected to get the desired BV of the device. If the effective thickness is reduced by etching, it causes reduced BV, or it increases the electric field in the given device, which increases the stress on the gate oxide region 4 and accelerates its deterioration. To reduce the effect of this problem, conventional techniques often involve using a thicker epi layer to begin with. However, epi growth is an expensive process and renders the starting material more expensive when compared to bulk (i.e., non-epi based substrate), single crystal substrate or the material needed for planar transistors. Hence, this is a significant disadvantage of conventional nonplanar devices. Another conventional nonplanar solution has been to increase the thickness of gate oxide region 20 at tip 21, to be able to sustain reliably the extra field strength in these pointed regions. Thicker gate oxide regions mean longer oxidation steps, reduced gain and on resistance, thus reduced cost/performance ratio when compared to the planar device. Because of this, these conventional nonplanar devices are considered more suitable for low voltage devices, where the electric fields are lower, typical with BV below about 70 v.

The grooves and trenches produced in epi layers of conventional nonplanar devices impose severe step coverage problems for any deposited layers on top of the surface, like gate electrode material: metal or poly Si, passivation or interlayer insulators like oxide, nitride, polymers, polyimide etc. Also, because conventional nonplanar devices are dependent on grooves etched from the top surface, one is limited to what is possible by only etching from the top.

SUMMARY OF THE INVENTION

This invention relates to semiconductor devices, such as planar and non-planar transistor structures, and methods for making the semiconductor devices that can provide performance advantages, better reliability, and higher manufacturing yields than conventional devices and methods.

A method according to the invention starts by creating a recess in the upper surface of a base layer of a semiconductor device. Next, an epitaxial (epi) layer is grown on the upper surface of the base layer. A semiconductor element, such as a well or a gate, is formed on the epi layer; the semiconductor element is typically aligned with the recess in the upper surface of the base layer. The growing step is preferably carried out in a manner to create a surface depression in the outer surface of the epi layer, the surface depression being generally aligned with the recess. The present invention is especially useful for making power transistors.

The invention takes advantage of the nonplanar structure at the outer surface of the epi layer while providing the option of smoothing out the outer surface of the epi layer if desired. Since the surface depression is created in the outer surface of the epi layer with the present invention, the outer surface of the epi layer, which is the critical surface, does not have the drawbacks normally associated with trenching, grooving or other steps normally associated with nonplanar devices, including creating weak points in the gate oxide, accumulating of difficult-to-remove contaminants and particles created during the grooving or trenching processes, such contaminants and particles often creating weak and contaminated gate oxides. Further, the tendency of conventional nonplanar devices to have unstable turn on voltages, low oxide breakdown voltages and high failure rates under gate voltage bias tests, are substantially eliminated.

With the present invention the growth of the epi layers after etching the initial recess in the substrate smoothes out the rough and sharp edges of the etching, fills in some of the gaps and thus eliminates most of the disadvantages of conventional techniques used to create nonplanar transistor structures.

Other features and advantages of the invention will appear from the following description in which the preferred embodiments have been set forth in detail in conjunction with the accompanying drawings.

BRIEF DESCRIPTION OF THE DRAWINGS

FIGS. 6A–6C illustrate a sequence of steps used in construction of the Igbt of FIG. 7 in which different sized recesses are formed in the upper surface of the substrate of FIG. 6A, an n+ epi buffer layer is formed on the upper surface of the substrate of FIG. 6A to create pairs of closely spaced mesas, while

DESCRIPTION OF THE SPECIFIC EMBODIMENTS

Figure 5:
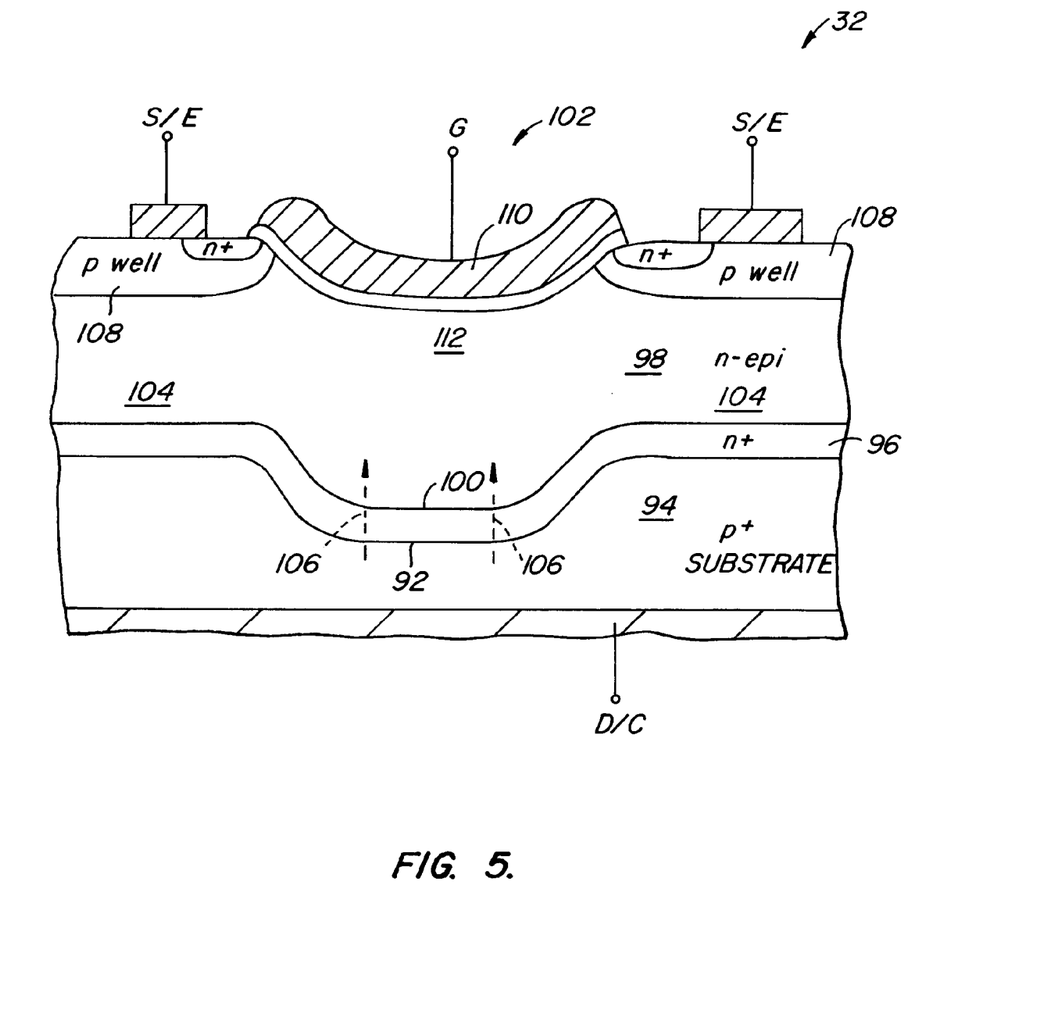
FIG. 5 illustrates the construction of the a prior art Igbt illustrating the injection of holes by the forward biased p+/n+ junction.

The present invention will be described with reference to an n-channel power Mosfet 30 (see FIG. 3) and an n-channel Igbt 32 (see FIG. 5). However, the invention is not limited to these types but extends to other types of semiconductor devices, in particular power transistors, as well.

Figure 2A:
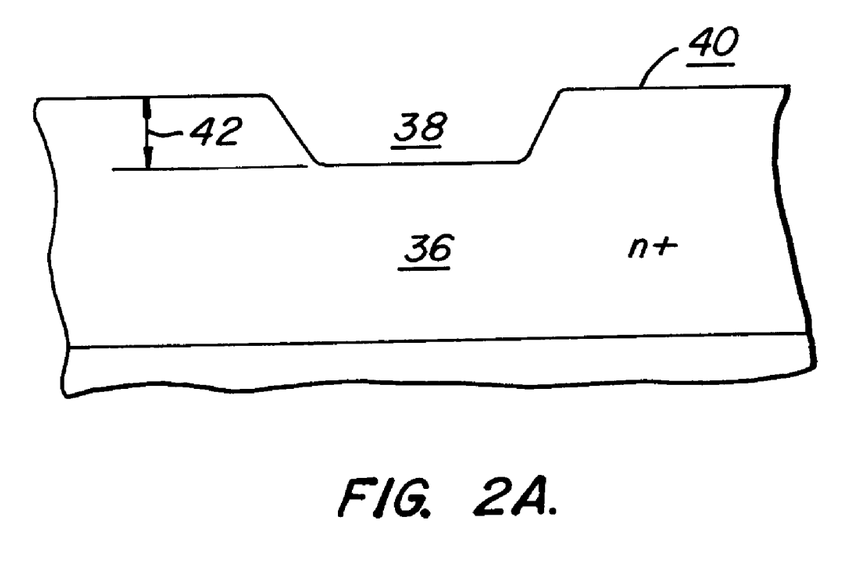
FIGS. 2A and 2B are simplified cross sectional views illustrating forming a recess on a substrate in FIG. 2A and the deposition of an epi layer in FIG. 2B, the outer surface of the epi layer having a surface depression generally aligned with recess in the substrate.
Figure 2B:
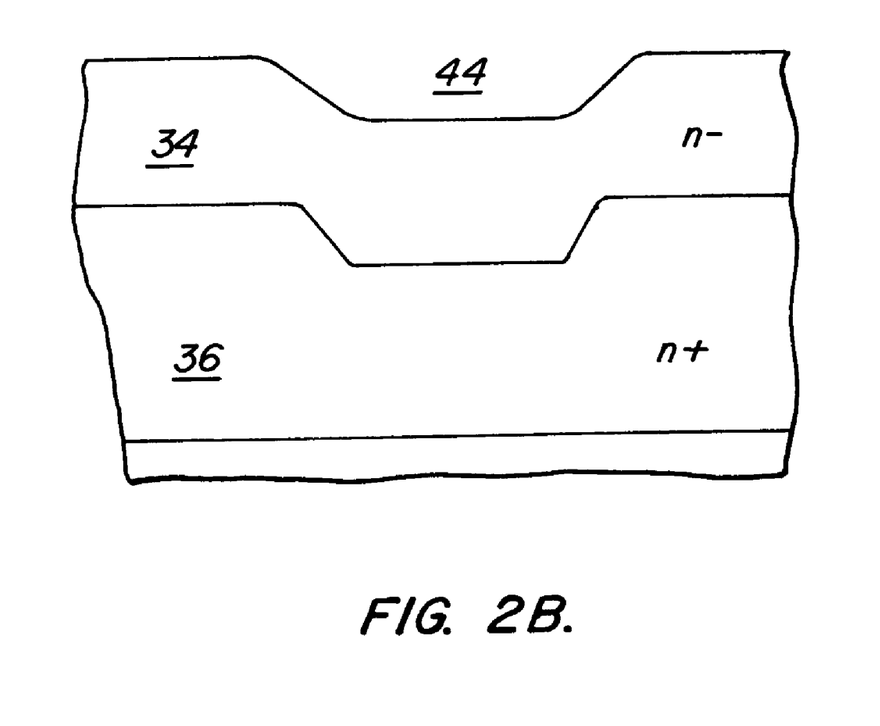
Figure 3:
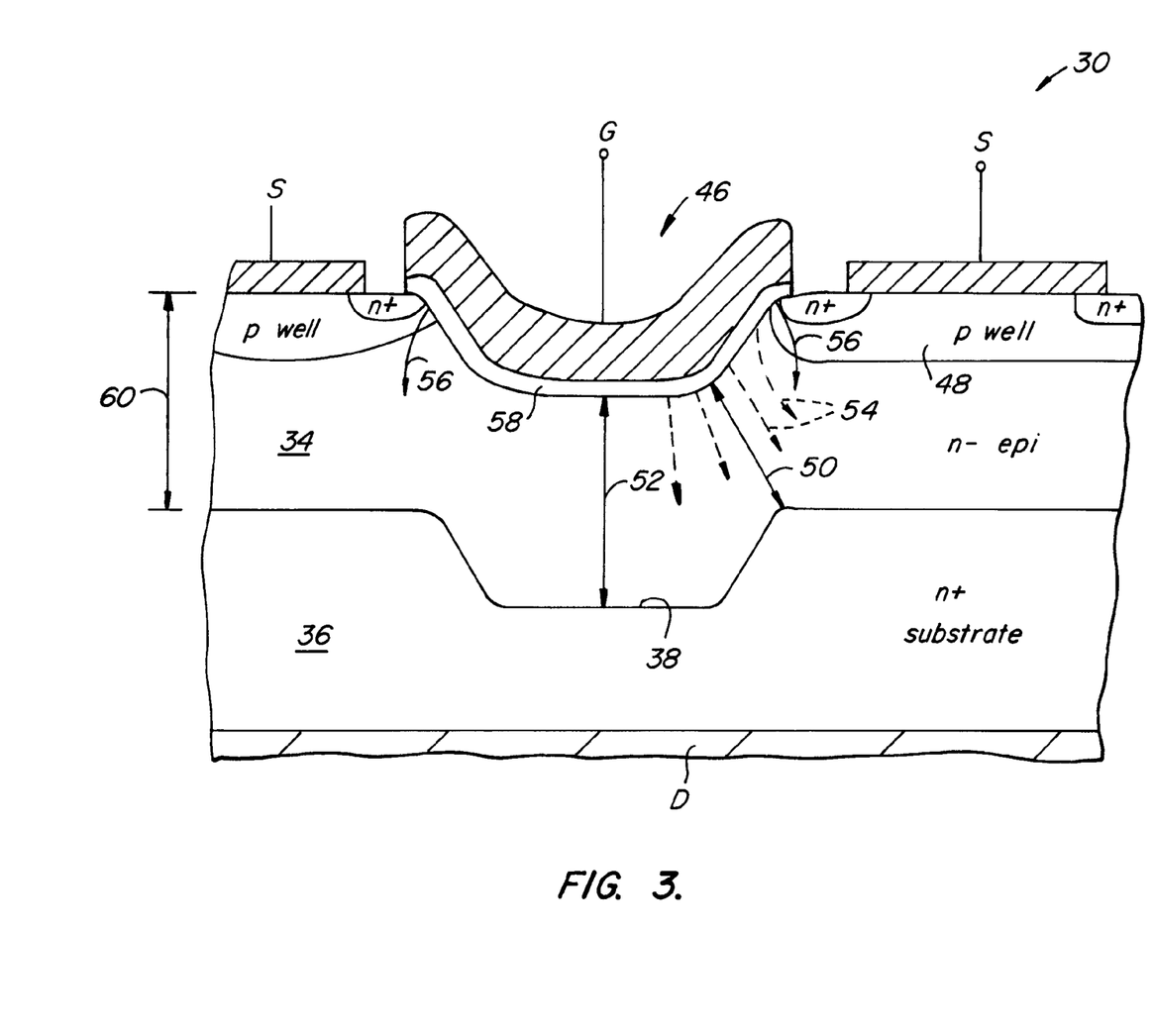
FIG. 3 illustrates a simplified cross sectional view of a nonplanar Mosfet made using the substrate and epi layer of FIG. 2B.

Referring now to FIGS. 2A, 2B and 3, an n– epi layer 34 is grown on an n+ substrate 36 that has trenches, grooves, or other recesses 38 etched onto and into it from the upper surface 40 of substrate 36 to a desired depth 42, typically about 1 micron to 20 microns. For voltages higher than about 100 v, depth 42 is greater. As epi layer 34 is grown, see FIG. 2B, recesses 38 on substrate 36 create smoothly curving surface depressions 44, which are much easier to process than the prior art grooves or channels, such as the V groove etched into epi layer 18 in FIG. 1. The top active surface of Mosfet 30 at surface depressions can be designed to match or overlap the recesses 38 below, to any given degree, based on the objective performance goals for the device. The example given in FIG. 3 is of a gate 46 overlapping the recess 38 as one possible structure. Another possibility is of well region 48 overlapping recess 38.

In the structure of FIG. 3, the on resistance, Ron, of Mosfet device 30 is reduced compared to a planar power Mosfet. This is because the MOS channel area 56 is directed downwardly towards the n+ substrate 36, a shorter distance to the substrate along path 50, than along path 52. Because n-epi layer 34 is of high resistivity, it is a major contributor to the Ron of the device. Dashed arrows 54 indicate the flow of the electrons via MOS channel 56 and accumulation layer 58, to and through epi layer 34 to the drain D under normal operation in the on state. The effective distance to substrate 36 along path 50 is shorter than in a planar power Mosfet device which is typically equal to the thickness h of epi layer 34. The distance of path 52 is about equal to thickness 60 of epi layer 34.

Figure 4:
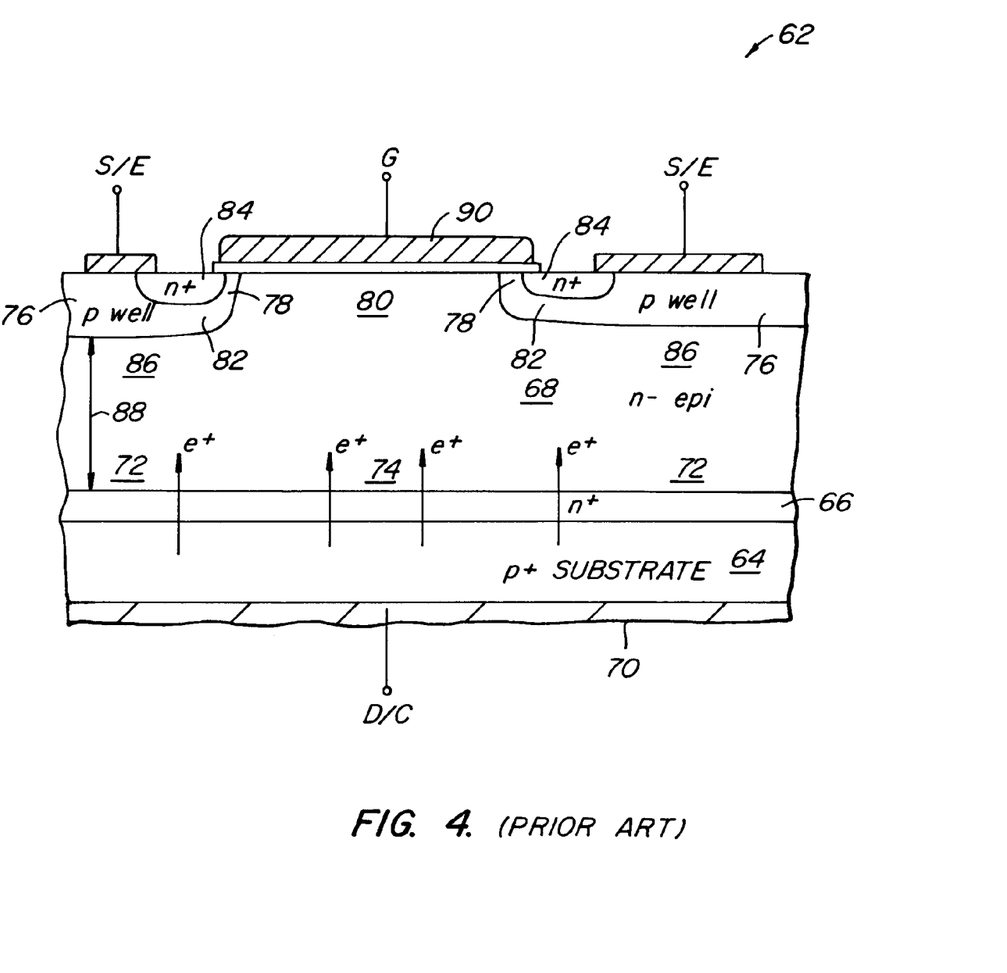
FIG. 4 illustrates an Igbt made according to the invention in which an epi buffer layer is formed on top of the upper surface substrate with the main epi layer formed on top of the buffer layer.

A conventional Igbt 62, see FIG. 4, is constructed on a p type substrate 64. See the following references relating to conventional Igbt structures: B. J. Baliga et al., "The Insulated Gate Rectifier (IGR): A new power switching device", *Proceeding of the IEDM*, December 1982, pp. 264–267. B. J. Baliga, "How The Super-Transistor Works", *Scientific American: "The Solid State Century"*, 1997 pp. 34–41. U.S. Pat. No. 4,639,754, C. F. Wheatly et al., Jan. 27, 1987. U.S. Pat. No. 5,086,324, H. Hagino, Feb. 4, 1992.

In the example of FIG. 4, Igbt 62 uses a p+ substrate 64, onto which an n+ buffer layer 66 and an n– layer 68 is added, such as by epitaxial methods. The Igbt operation is based on turning on the n channel Mosfet, which forces holes to be injected by the forward biased p+/n+ junction, at substrate 64 and buffer layer 66 of the drain D (or collector C) side 70 of Igbt device 62. This injection creates the conductivity modulation of the n– epi layer 68, thus reducing the effective on resistance of the device compared to an equivalent Mosfet. However, these injected holes are present in the n– epi layer 68 of device 62 and upon turn-off need to disappear or be removed rapidly for a fast turn-off.

These holes stored in n-epi region 68 create the stored charge, a device physics term borrowed from bipolar junction transistor (BJT) physics and used to model and explain the slow switching speed of the Igbt and the inducement of latching and failures. With conventional planar and nonplanar structures, the hole injection is uniform from the p+ collector into the n+/n– region; this is because the p+/n+ backside junction structure is fairly planar and uniform. This uniform hole injection is shown in FIG. 4 by the e+ arrows for holes injection. The charge injection density or the hole current density is uniform across areas 72 and 74. The holes injected in areas 72 will be readily collected by the p wells 76 and then through the source/emitter S/E electrode, representing part of the current flow through the Igbt in its on state. This part of the current is also referred to as the pnp transistor current, or the bipolar current mode of the Igbt.

The other part of the current is the current flow via the n channel of the Mosfet part of the Igbt, this current is composed of electrons flow via channels 78, through epi region 80, then recombining mainly with the holes injected from area 74. The third part of the current flow is of the holes that are injected mainly in area 74 and its vicinity, which flow to p wells 76, but through pinched p well regions 82 located under n+ sources 84 and channels 78. A part of these holes recombine with electrons in p wells 76, and a part flow to S/E electrode via the pinched p well regions 82 under n+ sources 84. If the hole current in pinched regions 82 create a potential drop of about 0.6 v, it can forward bias the n+/p well junction and induce extra electron injection from n+ source 84 much like a BJT emitter, which can trigger latching of Igbt 62 like an SCR. See U.S. Pat. No. 4,199,774. On turn-off of an Igbt, for it to be a fast turn-off without the risk of latching or failure, it is essential to remove the stored charge in n– epi layer 68, the stored charge having resulted from the on state when the holes were injected to create the conductivity modulation. The holes injected in the areas directly under p wells 76 are removed faster due to the shorter path they have from areas 72 to regions 86 as indicated by arrow 88 However those injected under gate 90 at area 74 stay much longer unremoved, and create a longer turn-off period, and the latching effect like an SCR as described above, (page 6, lines 24–29). These holes must migrate a longer distance via region 80 to the adjacent p well 76 in a longer path than the distance 88 in FIG. 5 for the holes in region 72.

The present invention improves the performance of a conventional Igbt by modifying the hole injection such that less injection occurs in some areas compared to others. Igbt 32, see FIG. 5, has a recesses 92 formed in the p+ substrate 94 and an n+ epi buffer layer 96 formed on substrate 94. An n– epi layer 98 is formed on buffer layer 96 and forms a recess 100 aligned with recess 92. When a gate 102 is aligned with recess 100, where n+ buffer layer 96 is grown as shown, the hole injection is reduced compared to the other areas, like that of areas 104. The reduced hole injection area is marked for illustration as broken arrows labeled 106 in FIG. 5. Igbt device 32 more rugged against latch up failures, is a faster switching device and performs better under high current (such as above 100 A/cm.sq.) and higher temperature operation (typically above about 25° C.) than conventional planar and nonplanar Igbt devices.

For performance optimization for other characteristics, one can elect to align recessed regions 100 under p wells 108 instead of gate 110. The invention contemplates any degree of overlap, based on the desired specifications of the device. Also, the size, proportions and geometry of the recessed regions 100 and the regions not so recessed can be varied in absolute terms and relative to each other. Generally, to limit the injection under gate area 112, one would make recessed region 100 similar to the geometry of gate 110 and areas 104 similar to p well regions 108.

Figure 6A:
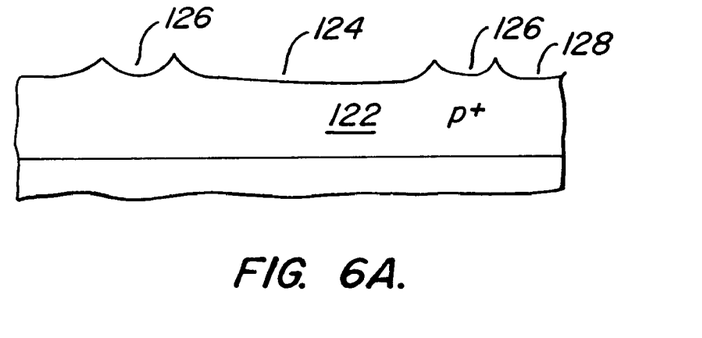
Figure 6B:
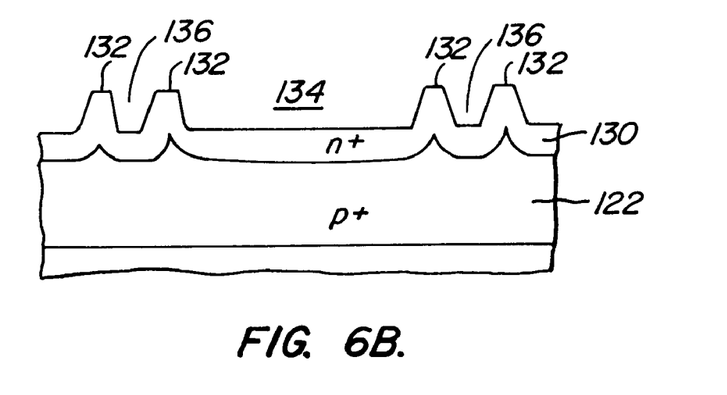
Figure 6C:
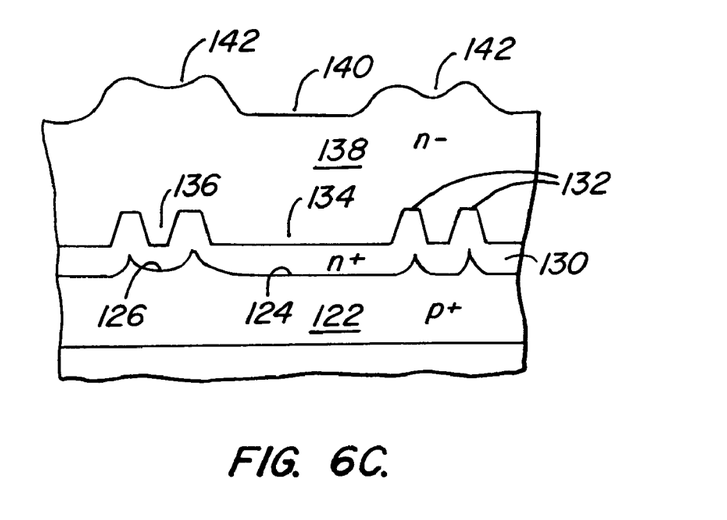
FIG. 6C illustrates formation of the n– epi layer on top of the n+ epi buffer layer.
Figure 7:
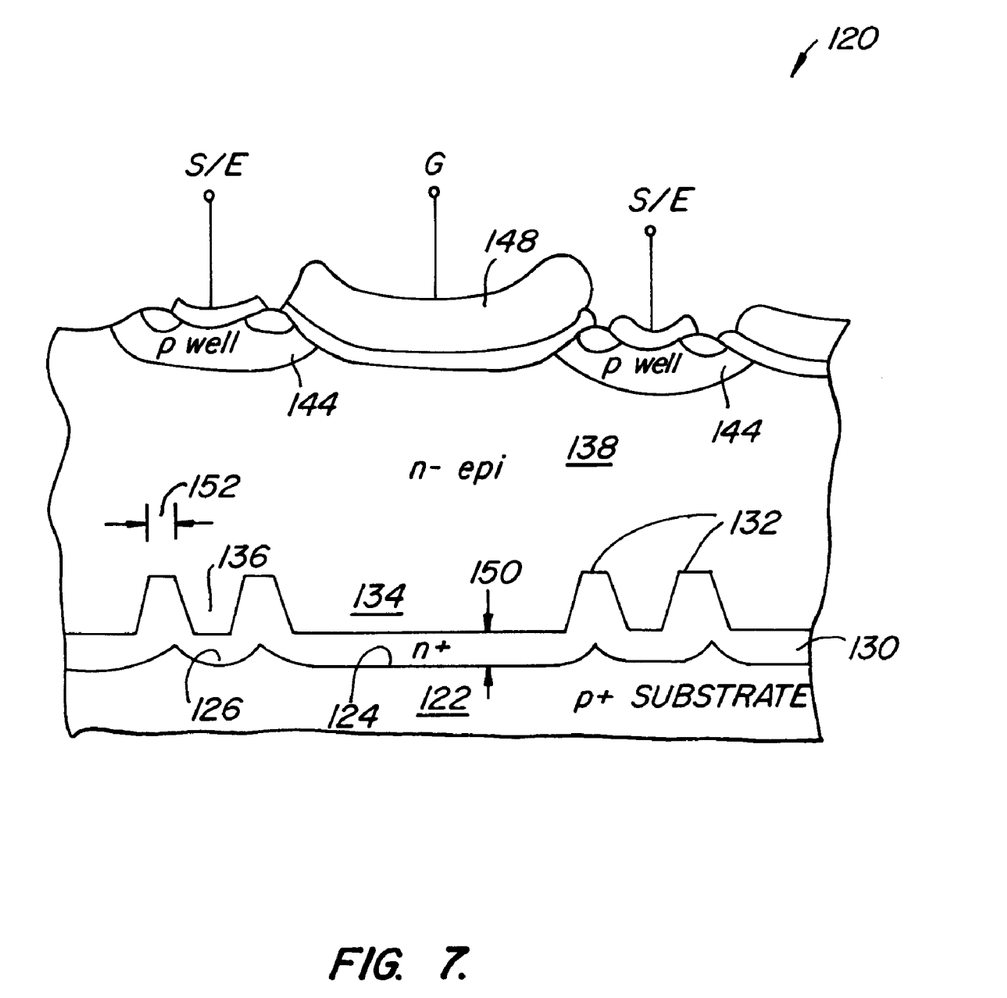
FIG. 7 illustrates an Igbt made using the structure of FIG. 6C.

FIG. 7 illustrates another embodiment of this invention, that is an n-channel Igbt 120. Igbt 120 is a nonplanar structure with nonuniform hole backside injection. Referring to FIGS. 6A–6C, a p+ substrate 122 of Igbt 120 has both wide recesses 124 and narrow recesses 126 formed in the upper surface 128. An n+ epi buffer layer 130, see FIG. 6B, is formed on upper surface 128 creating n+ mesas 132 with wide mesa recesses 134 formed between mesas 132 and aligned with wide recesses 124 and with narrow mesa recesses 136 between pairs of mesas 132 and aligned with narrow recesses 126. FIG. 6C shows an n– epi layer 138 formed on buffer layer 130 with deep and shallow surface depressions 140, 142 aligned with wide and narrow mesa recesses 134, 136.

In this concept recesses 134, 136, are larger in size than the mesa regions 132. Since Igbt 120 contains the n+ buffer layer 130 between the p+ substrate 122 and the n– epi layer 138, one has the option of creating full n+ mesas 132 as in FIGS. 6B, 6C and 7, which are effective in creating non-uniform hole injecting Igbts. The locations of mesas 132 and the mesa to mesa spacing affects the degree of injection, and the degree of top surface non-planarity. The closer the mesas are to each other, the less pronounced will be the top surface depression, after the growth of n– epi layer 15. For example, surface depression 142 above mesas recess 136 is shallower than surface depression 140 above mesa recess 134 due to the epitaxial filling of SI material in mesa recess 136. Mesas 132 reduce the hole injection through it, more than the large mesa recess 134 due to a thinner n+ buffer layer 130. It is preferable to position mesas 132 under p wells 144 in this embodiment as to prevent a wavy nonplanar gate oxide layer 146 under gate 148. However, for differing Igbt characteristics, one can design the device where, for example, multiple mesas 132 are placed directly under gate 148. The side slope of mesas 132 can be controlled in the etching process selected.

The processing steps starts with the corresponding substrate, which is etched according to the desired grooves, trenches or mesa pattern for a particular design. For a Mosfet, n-channel one starts with an n+ substrate, p-channel with p+ substrate. After the etching, the low resistivity epi is grown with the specified resistivity and thickness for the desired BV of the device, n– epi for n-channel & p– epi for p-channel.

For an Igbt the process starts with etching recesses 124, 126, on a p+ substrate for n-channel and n+ substrate for a p-channel. An n+ epi 130 buffer layer is grown first followed by an n– epi layer 138 for an n-channel, a p+ buffer and p– epi for a p-channel Igbt. The buffer layers can typically vary from 1 micron to 100 microns thick. In a variation to the Igbt epi process, after the recess etching, the buffer layer can be formed by diffusion step, where the proper dopant is first deposited, such as by ion implantation, spin on coating, or diffusion pre-deposition, using phosphorous etc. for the n-channel, and boron etc. for the p channel.

The diffusion buffer layer formation is the preferred step for the mesa Igbt structure of FIG. 7. The narrow mesa gets the diffused dopant from all sides thus creating n+ mesas for n– channel Igbt, (similarly p+ mesas for p– channel Igbt). The design rules for the mesa size to ensure full dopant coverage has to match the desired diffused buffer depth in the non mesa area. If an n+ buffer diffused depth 150 is selected, after etching the mesa diameter or width 152 will preferably not exceed twice depth 150.

The etching process on the substrate can vary from, for example, wet etching to plasma etching, to reactive ion etching, to ion milling, to dry etching. A wet etched process will create sloped surfaces for the mesas, while anisotropic dry etching will create sharper vertical or close to vertical walls. A combined dry/wet, or wet/dry, or wet/dry/wet or any other combination etching can be optimized for the desired slope.

Planar devices with the nonplanar substrate treatment as described above can be produced with added process steps, thus retaining the advantages of the nonplanar internal structure and a top planar surface, which results in higher processing yield. One method is to use a polishing, or etching or a combination thereof, step after the n− epi growth is complete, to render the top surface flat. Another method is to make many of mesas 132 of FIG. 7 narrow or small in diameter and position them close to each other, such as where their spacing is equal or less than their height. Thus in the follow up growth of the thick n− epi layer 138, mesa recesses 134, like mesa recesses 136, will be filled, but no depression 140, 142, or effectively no depression, will be formed on the top surface of epi layer, thus minimizing or eliminating any polishing or similar process on the top surface.

For all structures once the n− epi layer has been grown, or the top surface treatment of the epi layer is done, the wafers are ready for standard CMOS, DMOS, Igbt or any combination thereof in processing the final power transistor or other semiconductor device.

Modification and variations can be made to the disclosed embodiments without departing from the subject of invention as defined in the following claims.

Any and all patents, applications and printed publications referred to above are incorporated by reference.

What is claimed is:

1. A method for modifying a performance characteristic of a semiconductor device while producing the semiconductor device comprising:

creating a recess in an upper surface of a base layer, the base layer comprising a chosen one of a p+ or n+ substrate;

growing an epitaxial (epi) layer on the upper surface, the epi layer having an outer surface; and forming, on the epi layer, a semiconductor device element associated with the recess.

2. The method according to claim 1 wherein the growing step is carried out to create a surface depression in the outer surface of the epi layer generally aligned with the recess.

3. The method according to claim 2 further comprising processing the outer surface of the epi layer to at least partially remove said surface depression from said outer surface prior to the forming step.

4. The method according to claim 1 wherein the creating step is carried out with the substrate comprising an n+ substrate and the growing step is carried out with the epi layer comprising an n− epi layer.

5. The method according to claim 1 wherein the forming step is carried out so the semiconductor device element is generally aligned with the recess.

6. The method according to claim 1 wherein the forming step comprises the step of forming a gate oxide region.

7. The method according to claim 1 wherein the forming step comprises the step of forming a doped well.

8. The method according to claim 1 further comprising growing a buffer layer on the upper surface prior to the epi layer growing step.

9. A method for modifying a performance characteristic of a semiconductor device while producing the semiconductor device comprising:

creating a recess in an upper surface of a base layer;

growing an epitaxial (epi) layer on the upper surface, the epi layer having an outer surface;

the growing step being carried out to create a surface depression in the outer surface of the epi layer generally aligned with the recess;

processing the outer surface of the epi layer to at least partially remove said surface depression from said outer surface, and then forming, on the epi layer, a semiconductor device element associated with the recess.

\* \* \* \* \*